United States Patent
Miyako (10) Patent No.: US 7,848,171 B2
(45) Date of Patent: Dec. 7, 2010

(54) SEMICONDUCTOR MEMORY DEVICE COMPENSATING LEAKAGE CURRENT

(75) Inventor: Satoyuki Miyako, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 98 days.

(21) Appl. No.: 12/124,799

(22) Filed: May 21, 2008

(65) Prior Publication Data

US 2008/0298155 A1 Dec. 4, 2008

(30) Foreign Application Priority Data

May 28, 2007 (JP) .............................. 2007-140340

(51) Int. Cl.
*G11C 5/14* (2006.01)

(52) U.S. Cl. ...................... 365/227; 365/228; 365/226; 365/203; 365/206

(58) Field of Classification Search ................. 365/227, 365/226, 228, 203, 206
See application file for complete search history.

(56) References Cited

U.S. PATENT DOCUMENTS

| | | | | |
|---|---|---|---|---|
| 4,371,956 A * | 2/1983 | Maeda et al. | .......... | 365/185.21 |
| 6,181,626 B1 * | 1/2001 | Brown | ....................... | 365/210.1 |
| 6,335,893 B1 * | 1/2002 | Tanaka et al. | ................ | 365/226 |
| 6,343,039 B2 * | 1/2002 | Agawa et al. | ................ | 365/203 |
| 6,343,045 B2 * | 1/2002 | Shau | ........................... | 365/227 |
| 6,452,852 B2 * | 9/2002 | Bohm et al. | ................. | 365/222 |
| 6,501,687 B2 * | 12/2002 | Choi | ...................... | 365/189.11 |
| 6,657,911 B2 * | 12/2003 | Yamaoka et al. | ............. | 365/226 |
| 6,738,280 B2 * | 5/2004 | Satomi | .......................... | 365/94 |
| 6,801,463 B2 * | 10/2004 | Khellah et al. | ............... | 365/203 |
| 6,967,875 B2 * | 11/2005 | Chen et al. | ............. | 365/189.08 |
| 7,085,184 B1 * | 8/2006 | Walther et al. | ............... | 365/203 |
| 7,085,187 B2 * | 8/2006 | Koshikawa et al. | ......... | 365/229 |
| 7,161,844 B2 * | 1/2007 | Sarin et al. | ............. | 365/189.03 |
| 7,193,926 B2 * | 3/2007 | Park et al. | ............... | 365/230.06 |
| 7,245,526 B2 * | 7/2007 | Oh et al. | ....................... | 365/163 |
| 7,248,494 B2 * | 7/2007 | Oh et al. | ...................... | 365/148 |
| 7,355,893 B2 * | 4/2008 | Ema | ........................ | 365/185.28 |
| 7,379,362 B2 * | 5/2008 | Abe et al. | ..................... | 365/203 |
| 7,573,748 B2 * | 8/2009 | Bedarida et al. | ........ | 365/185.21 |

FOREIGN PATENT DOCUMENTS

| | | |
|---|---|---|
| JP | 2002-208280 | 7/2002 |
| JP | 2006-079812 | 3/2006 |

\* cited by examiner

*Primary Examiner*—Viet Q Nguyen
(74) *Attorney, Agent, or Firm*—Turocy & Watson, LLP (57) ABSTRACT

A cell array has a plurality of memory cells arranged in a matrix. Each one terminal of a plurality of switching circuits is connected to a bit line. A leakage current compensating circuit has an output node connected in common to the other terminal of the switching circuit. The leakage current compensating circuit comprises a plurality of MOSFETs. Each MOSFET has the same conduction type as a MOSFET whose output node is directly connected to the bit line in the memory cell. Each MOSFET of the leakage current compensating circuit has a gate electrode connected to a first voltage node and a source electrode connected to a second voltage node, and thereby, being biased so that the MOSFET turns off.

9 Claims, 8 Drawing Sheets

SEMICONDUCTOR MEMORY DEVICE COMPENSATING LEAKAGE CURRENT

CROSS-REFERENCE TO RELATED APPLICATIONS

This application is based upon and claims the benefit of priority from prior Japanese Patent Application No. 2007-140340, filed May 28, 2007, the entire contents of which are incorporated herein by reference.

BACKGROUND OF THE INVENTION

1. Field of the Invention

The present invention relates to a semiconductor memory device; for example, a static memory (SRAM) and read only memory (ROM). In particular, the present invention relates to a compensating circuit compensating a leakage current of a bit line.

2. Description of the Related Art

For example, when an N-type ROM circuit reads high data, the bit line potential goes low because of a bit line leakage current. For this reason, there is a problem that a read error occurs. There has been known the following N-type ROM circuit in order to solve the foregoing read operation problem by bit line leakage current. The N-type ROM circuit includes a keeper circuit for holding a bit line potential. The keeper circuit solves the read operation problem by the bit line leakage current using on current flowing through a P-channel insulated gate MOS transistor (PMOSFET). However, it is general that the bit line leakage current increases when the circuit becomes high temperature. But, the foregoing on current of the MOSFET of the keeper circuit decreases when the circuit becomes high temperature. Thus, there is a problem that the keeper circuit effect remarkably changes depending on temperature conditions.

Accordingly, it is desired to provide a semiconductor memory device, which can reduce an influence of a read operation by bit line leakage current, and is stabilized so that the foregoing effect does not remarkably change depending on temperature conditions.

Jpn. Pat. Appln. KOKAI Publication No. 2002-208280 discloses a bit line potential pull-up circuit. The bit line potential pull-up circuit compensates a leakage current generated in a bit line, and thereby, prevents an operation delay when a low-power semiconductor memory element is driven and malfunction of a sense amplifier.

BRIEF SUMMARY OF THE INVENTION

According to a first aspect of the invention, there is provided a semiconductor memory device comprising: a cell array having a plurality of memory cells arranged in a matrix; a plurality of word lines formed to correspond to each row of the cell array, and each connected to the memory cell; a plurality of bit lines formed to correspond to each column of the cell array, and each connected to the memory cell; a plurality of switching circuits provided to correspond to each bit line, each one terminal of the switching circuit being connected to the corresponding bit line; and a leakage current compensating circuit having an output node connected in common to the other terminal of the switching circuit, the switching circuits being each controlled so that only a circuit connected to a bit line of a selected column in the cell array conducts, the leakage current compensating circuit comprising a plurality of MOSFETs, each MOSFET having the same conduction type as a MOSFET whose output node is directly connected to the bit line in the memory cell, each MOSFET of the leakage current compensating circuit having a drain electrode connected to the other terminal of the switching circuit, a gate electrode connected to a first voltage node and a source electrode connected to a second voltage node, and thereby, being biased so that the MOSFET turns off.

According to a second aspect of the invention, there is provided a semiconductor memory device comprising: a cell array having a plurality of memory cells arranged in a matrix; a plurality of word lines formed to correspond to each row of the cell array, and each connected to the memory cell; a plurality of bit lines formed to correspond to each column of the cell array, and each connected to the memory cell; a plurality of switching circuits provided to correspond to each bit line, each one terminal of the switching circuit being connected to the corresponding bit line; and a leakage current compensating circuit having an output node connected in common to the other terminal of the switching circuit, wherein the leakage current compensating circuit comprises a plurality of MOSFETs, each of the MOSFETs has a conduction type different from a MOSFET whose output node is directly connected to the bit line in the memory cell, a relation of a gate voltage (Vg) and a source voltage (Vs) supplying to each of the gate and the source electrodes of the MOSFETs and a threshold voltage (Vth) is set as $|Vg-Vs| <= Vth$, and each of the MOSFETs is biased to turn off.

DETAILED DESCRIPTION OF THE INVENTION

Various embodiments of the present invention will be hereinafter described with reference to the accompanying drawings. The same reference numerals are used to designate common portions over all drawings.

First Embodiment

Figures 1, 2:
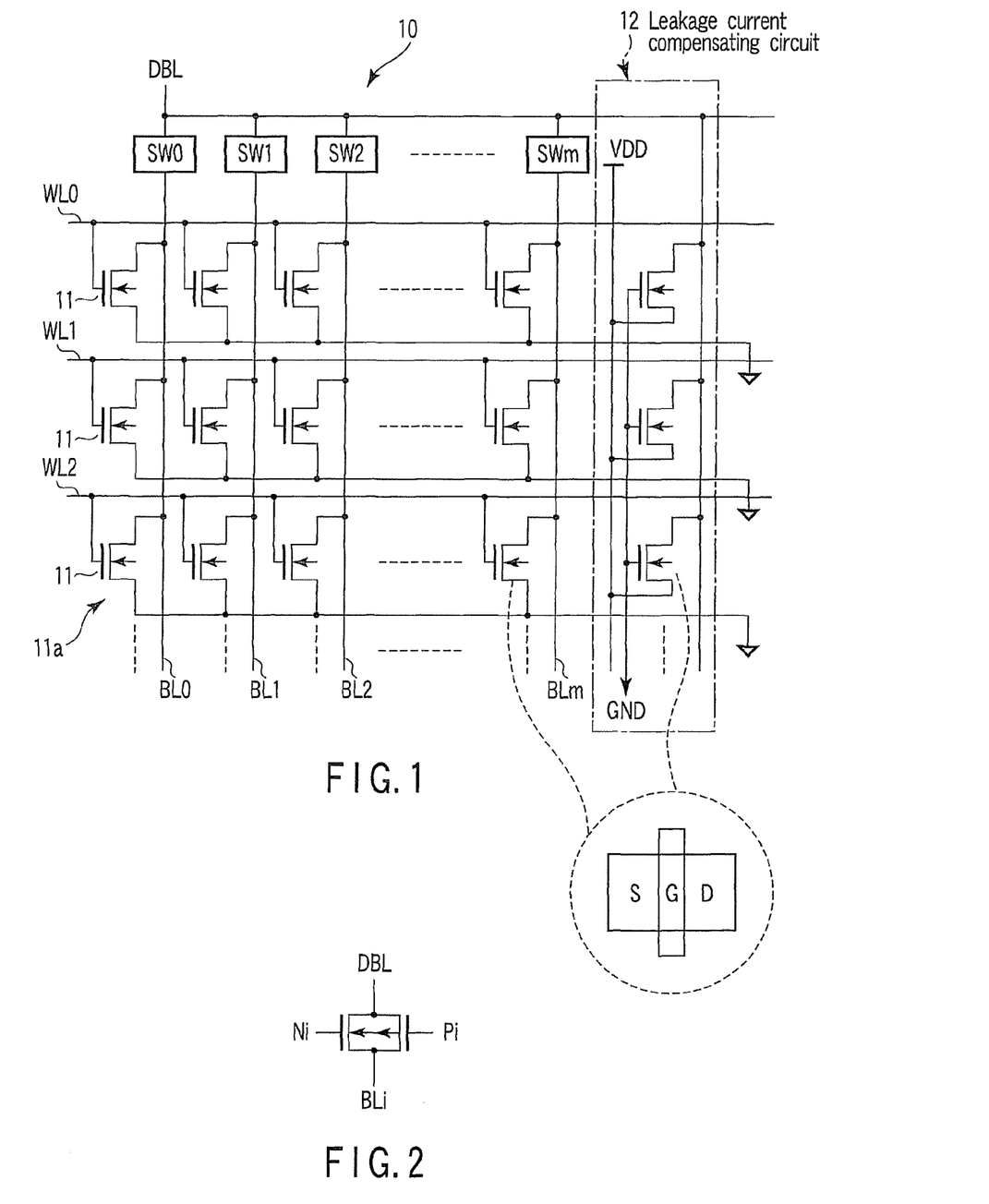
FIG. 1 is a circuit diagram showing the configuration of a part of a N-type ROM circuit according to a first embodiment of a semiconductor memory device of the present invention.
FIG. 2 is a circuit diagram showing the configuration a switching circuit shown in FIG. 1.

FIG. 1 is a circuit diagram showing the configuration of a part of a N-type ROM circuit according to a first embodiment of a semiconductor memory device of the present invention. An N-type ROM circuit 10 has a cell array 11a, a plurality of bit line BLi (i=0, 1, 2, . . . , m), a plurality of switching circuits SWi (i=0, 1, 2, . . . , m), and a leakage current compensating circuit 12.

The cell array 11a has N-type memory cells 11 each comprising an N-channel transistor (NMOSFET), which are arranged in a matrix. A plurality of word lines WLi (i=0, 1, 2, . . . ) is formed to correspond to each row of the cell array 11a. The foregoing bit lines BLi (i=0, 1, 2, . . . , m) are formed to correspond to each column of the cell array 11a, and each connected to an output node of the NMOSFET forming the memory cell 11. The foregoing switching circuits SWi (i=0, 1, 2, . . . , m) are each provided to correspond to each bit line. Each one terminal of the switching circuits is connected to the corresponding bit line while the other terminal (output node) is a common-connected bit line DBL. The leakage current compensating circuit 12 is connected to the bit line DBL.

The NMOSFET forming the N-type memory cell 11 has the following configuration. Specifically, an input node (gate) of the NMOSFET is connected to any of the word lines WLi, an output node (drain) thereof is connected to any of the bit lines BLi, and a source node is connected to a ground potential (GND) node. The switching circuits SWi (i=0, 1, 2, . . . , m) are equivalent to a column select circuit. For example, as shown in FIG. 2, the switching circuit comprises a CMOS transfer gate configured in such a manner that a MOSFET and a PMOSFET are connected in parallel. These MOSFET and PMOSFET are controlled according to complementary signals (column select signal) Ni and Pi. Thus, MOSFET and PMOSFET only connected to the bit line corresponding to the column selected in the cell array 11a are controlled to conduct.

The leakage current compensating circuit 12 is composed of one or some NMOSFETs. According to the first embodiment, the leakage current compensating circuit 12 comprises a plurality of NMOSFETs having the same polarity as NMOSFET, which is a factor of generating a bit line leakage current. The NMOSFETs have the following configuration; specifically, an output node of the NMOSFET in the memory cell is connected to the bit line. A gate electrode of each NMOSFET forming the leakage current compensating circuit 12 is connected to a first voltage (e.g., GND) node, a drain electrode thereof is connected to the bit line DBL, and a source electrode is connected to a second voltage (e.g., power supply voltage VDD) node. The foregoing configuration is employed, and thereby, the MOSFET is biased to turn off. The leakage current of the leakage current compensating circuit 12 compensates a bit line leakage of the selected column in the cell array 11a.

In the N-type ROM circuit 10 of the first embodiment, a charge is pre-charged to each bit line BLi for a pre-charge time. Thereafter, a specific row is selected for an active time while the switching circuit SWi of a specific column is selected to select a specific memory cell 11. In this way, an output of the leakage current compensating circuit 12 and the bit line BLi of the selected column conduct via the conductive state selected column switching circuit SWi and the bit line DBL. Therefore, the potential of the bit line BLi of the selected column is determined in accordance with a data storage state of the selected memory cell 11. Thus, high or low data is read from the selected memory cell 11.

When high data is read, the charge pre-charged to the bit line BLi is pulled out by a cell current of the selected memory cell; as a result, a bit line leakage current is generated. For this reason, the bit line potential changes by the bit line leakage current. However, in this case, a charge is supplied from the output node of the leakage current compensating circuit 12 to the bit line BLi of the selected column in the cell array 11a. Thus, the bit line leakage current is compensated by a leakage current from the leakage current compensating circuit 12.

According to the first embodiment, the foregoing operation is carried out, and thereby, an influence of the read operation by the bit line leakage current of the selected column is reduced. Thus, a change of the bit line potential is reduced or prevented.

In addition, the leakage current compensating circuit 12 comprises the same NMOSFET as the memory cell 11. Thus, if a bit line leakage current rate changes depending on temperature and voltage conditions, a compensation leakage current rate output from he leakage current compensating circuit 12 changes like the NMOSFET of the memory cell 11. Therefore, the bit line leakage current rate and the compensation leakage current rate are kept to a constant ratio without depending on temperature and voltage conditions.

As a result, the effect of reducing or preventing a change of the bit line potential affecting a read operation by bit line leakage does not remarkably change depending on temperature and voltage conditions. Therefore, a stable operation and yield are realized.

According to the first embodiment, a leakage current of a non-select bit line, which is a factor of a read error operation is compensated using the leakage current by the leakage current compensating circuit 12. In this way, the read error operation is prevented. Moreover, the bit line leakage current is compensated by an off current (leakage current) of the MOSFET. Therefore, the effect of preventing the read error operation is stably obtained without depending on temperature and voltage conditions.

Preferably, the MOSFET forming the leakage current compensating circuit 12 is configured as shown by a broken line in FIG. 1. Specifically, the MOSFET is configured using the same diffusion pattern shape as the MOSFET of the memory cell 11, the same gate pattern shape and the same dimension. And preferably, the MOSFET forming the leakage current compensating circuit 12 is uniformly arrayed like a matrix in the same manner as the cell array 11a. In this way, the uniformity of the following two currents is obtained. One is uniformity of a compensating current by processing the MOSFET forming the leakage current compensating circuit 12. Another is uniformity of a bit line leakage current by processing the MOSFET related to the bit line leakage current of the cell array 11a. Therefore, the foregoing effect is further stably obtained.

<First Modification Example of First Embodiment>

Figure 3:
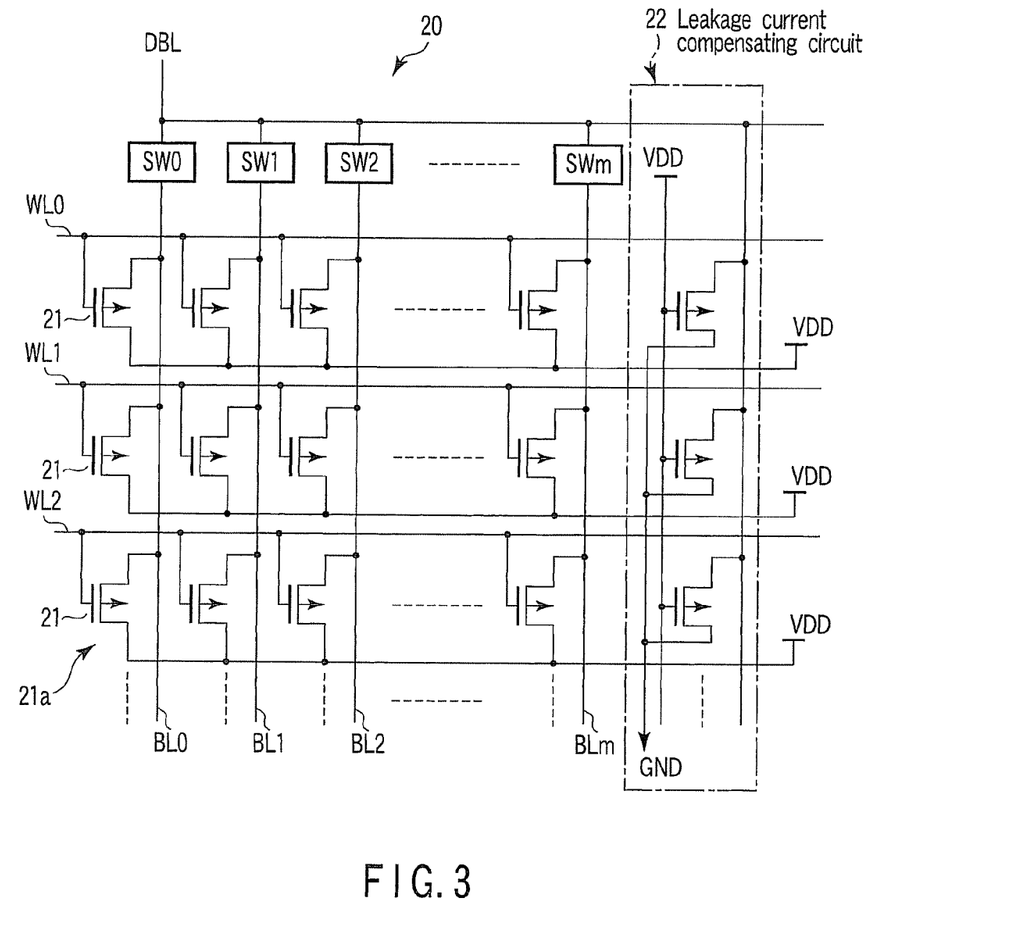
FIG. 3 is a circuit diagram showing the configuration of a part of a P-type ROM circuit according to a first modification example of the first embodiment.

FIG. 3 shows a first modification example of the first embodiment, and is a circuit diagram showing the configuration of a part of a P-type ROM circuit, for example. In a P-type ROM circuit 20, the NMOSFET used for the N-type ROM circuit 10 of the first embodiment is changed into a PMOSFET.

The P-type ROM circuit 20 includes a cell array 21a. The cell array 21a has P-type memory cells each comprising a PMOSFET, which are arranged in a matrix. A plurality of word lines WLi (i=0, 1, 2, . . . ) is formed to correspond to each row of the cell array 21a. A plurality of bit lines BLi (i=0, 1, 2, . . . , m) are formed to correspond to each column of the cell array 21a, and each connected to an output node of the PMOSFET forming a memory cell 21. The foregoing switching circuits SWi (i=0, 1, 2, ..., m) are each provided to correspond to each bit line. A plurality of switching circuits SWi (i=0, 1, 2, ..., m) are each provided to correspond to each bit line. Each one terminal of the switching circuits is connected to the corresponding bit line. The switching circuits SWi are controlled so that only circuits connected to the bit line corresponding to the selected column in the cell array 11a become active. A leakage current compensating circuit 22 comprises one or some PMOSFETs. An output node is connected in common to the other terminal of the switching circuit SWi.

The PMOSFET forming the P-type memory cell 21 has the following configuration. Specifically, a control node (gate electrode) is connected to the word line WLi, and an output node (drain electrode) is connected to the bit line BLi, and further, an input node (source electrode) is connected to a power supply voltage VDD node.

The leakage current compensating circuit 22 of this example has the following configuration. A plurality of PMOSFETs having the same polarity as the PMOSFET in the memory cell 21a is connected in parallel. In the PMOSFET in the memory cell 21a, the output node is connected to the bit line BLi; thus, this is a factor of generating a bit line leakage current. Each PMOSFET of the leakage current compensating circuit 22 has the following configuration. Specifically, the gate electrode is connected with a VDD node, the source electrode is connected with a GND node, and the drain electrode is connected to the other terminal of the switching circuit SWi. In this way, each PMOSFET is biased to turn off. The foregoing configuration is employed, and thereby, the leakage current compensating circuit 22 compensates a bit line leakage current of the selected column in the cell array 21a using a leakage current.

The foregoing P-type ROM circuit 20 operates in the same manner as the N-type ROM 10 of the first embodiment. Therefore, the same effect as the N-type ROM circuit is obtained.

Second Embodiment

Figure 4:
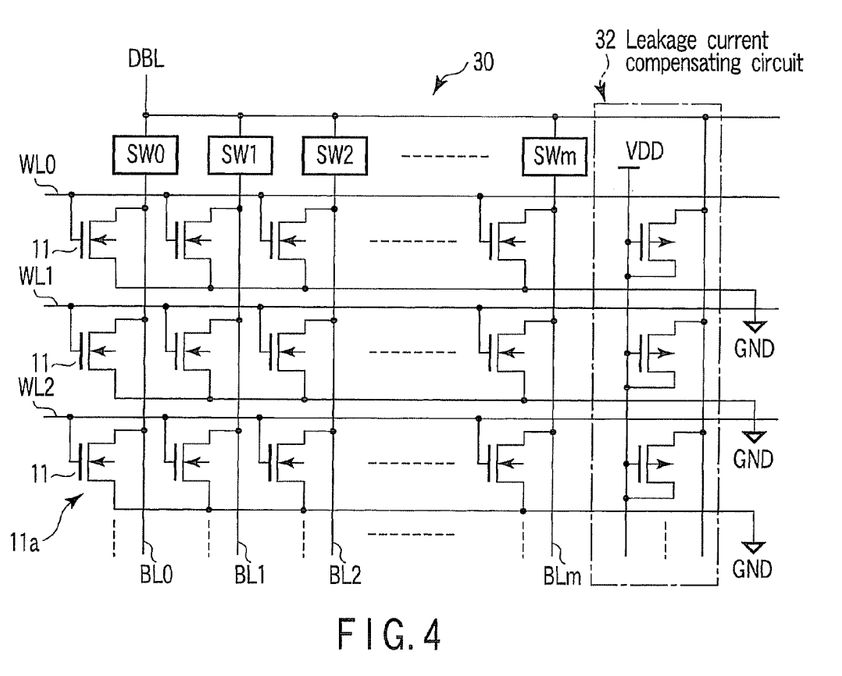
FIG. 4 is a circuit diagram showing the configuration of a part of a N-type ROM circuit according to a second embodiment.

FIG. 4 is a circuit diagram showing the configuration of a part of an N-type ROM circuit according to a second embodiment. An N-type ROM circuit 30 has a leakage current compensating circuit 32 having the configuration different from the N-type ROM circuit 10 of the first embodiment. The leakage current compensating circuit 32 has the following configuration. Specifically, in the NMOSFET of a memory cell 11, the output node is connected to the bit line. A plurality of PMOSFETs having a polarity different from the NMOSFET, which is a factor of generating a bit line leakage current, is connected in parallel. Each PMOSFET of the leakage current compensating circuit 32 has gate electrode and source electrode connected to a VDD node, and biased to turn off. That is, a relation of a gate voltage (Vg) and a source voltage (Vs) supplying to each of the gate and source electrodes and a threshold voltage (Vth) is set as $|Vg-Vs| \leq Vth$. In this way, the leakage current compensating circuit 32 compensates a bit line leakage current of the selected column in the cell array 11a using a leakage current.

The foregoing N-type ROM circuit 30 operates in the same manner as the N-type ROM 10 of the first embodiment. Therefore, the same effect as the N-type ROM circuit is obtained.

<First Modification Example of Second Embodiment>

Figure 5:
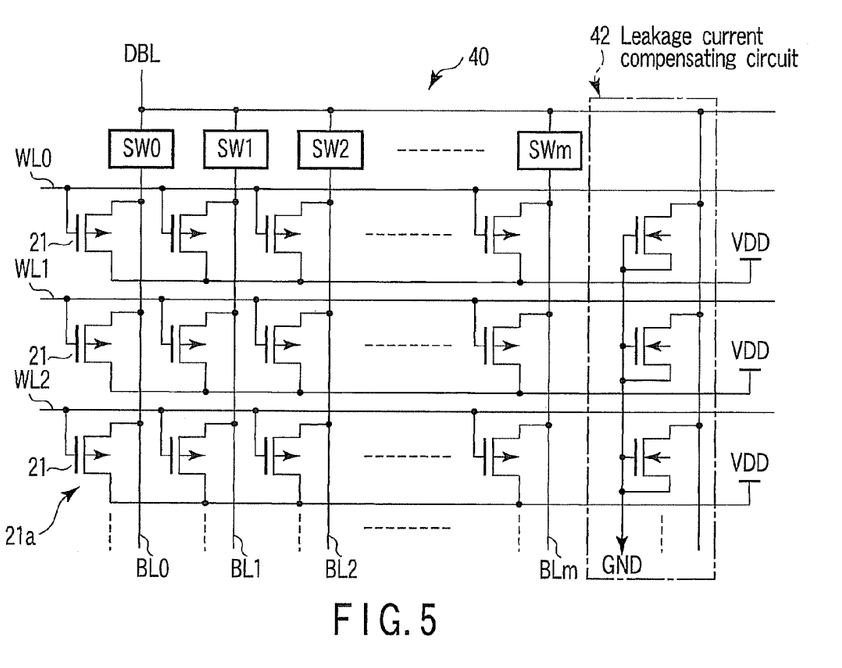
FIG. 5 is a circuit diagram showing the configuration of a part of a P-type ROM circuit according to a first modification example of the second embodiment.

FIG. 5 relates to a first modification example of the second embodiment, and is a circuit diagram showing the configuration of a part of a P-type ROM circuit. A P-type ROM circuit 40 differs from the N-type ROM circuit 30 of the second embodiment in the following point. Namely, in the P-type ROM circuit 40, the polarity of each MOSFET becomes reverse like the P-type ROM circuit 20 according to the first modification example of the first embodiment. In this case, a leakage current compensating circuit 42 has the following configuration. Specifically, in the MOSFET of a cell array 21a, the output node is connected to the bit line. A plurality of NMOSFETs having a polarity different from the PMOSFET, which is a factor of generating a bit line leakage current, is connected in parallel. Each NMOSFET of the leakage current compensating circuit 42 has gate electrode and source electrode connected to a GND node, and biased to turn off. In this way, the leakage current compensating circuit 42 compensates a bit line leakage current of the selected column in the cell array 21a using a leakage current.

The foregoing P-type ROM circuit 40 operates in the same manner as the N-type ROM 10 of the first embodiment. Therefore, the same effect as the N-type ROM circuit is obtained.

Third Embodiment

Figure 6:
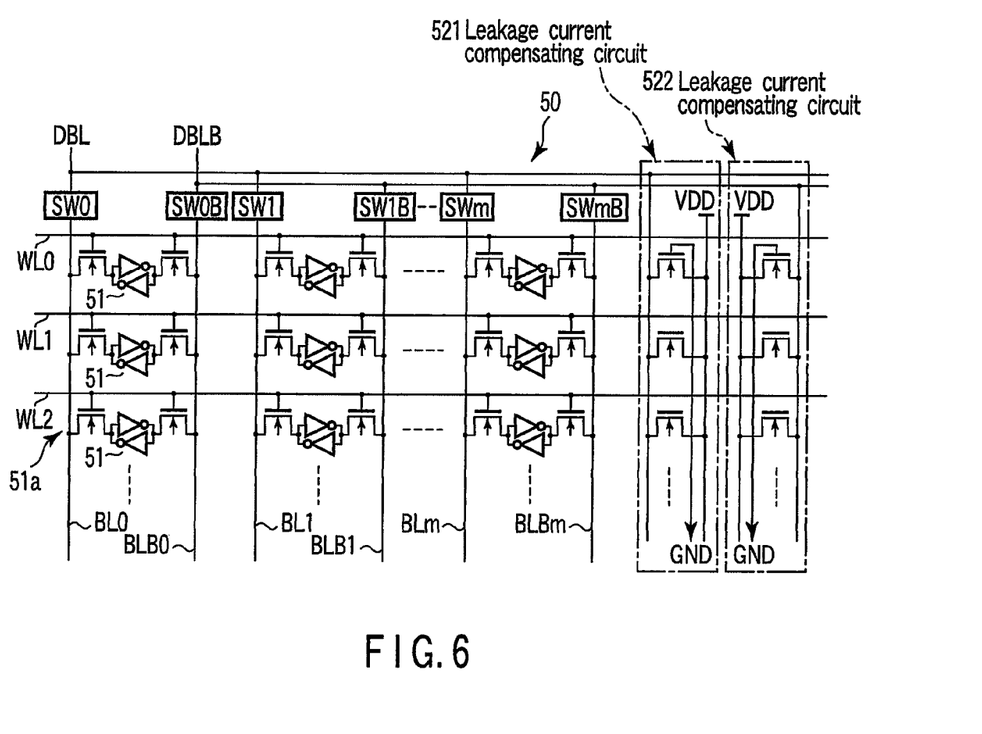
FIG. 6 is a circuit diagram showing the configuration of a part of an SRAM according to a third embodiment.

FIG. 6 is a circuit diagram showing the configuration of a part of an SRAM according to a third embodiment, and an example to which the first embodiment is applied. An SRAM 50 includes a cell array 51a. The cell array 51a has SRAM cells 51 comprising general six transistors, which are arranged in a matrix. A plurality of word lines WLi (i=0, 1, 2, ...) is formed to correspond to each row of the cell array 51a. Of bit line couples, a plurality of bit lines (i=0, 1, 2, ...) is formed to correspond to each column of the cell array 51a, and connected to one input/output node of the SRAM cell 51. A plurality of bit lines (inverted bit line) BLBi (i=0, 1, 2, ...) is connected to the other input/output node of the SRAM cell 51. One terminal of a plurality of switching circuits SWi (i=0, 1, 2, ..., m) is connected to each bit line BLi. One terminal of a plurality of switching circuits SWiB (i=0, 1, 2, ..., m) is connected to each bit line BLBi. These switching circuits SWi and SWiB are controlled so that only switching circuits connected to the selected bit line in the cell array 51a conduct. First and second leakage current compensating circuits 521 and 522 each comprises one or some NMOSFETs. An output node of each NMOSFET of the first leakage current compensating circuits 521 is connected in common to the other terminal of the switching circuit SWi. An output node of each NMOSFET of the second leakage current compensating circuits 522 is connected in common to the other terminal of the switching circuit SWiB. The gate electrode of each NMOSFET of the first and second leakage current compensating circuits 521 and 522 is connected to a GND node. An input node of each NMOSFET is connected to a VDD node.

Figure 7A:
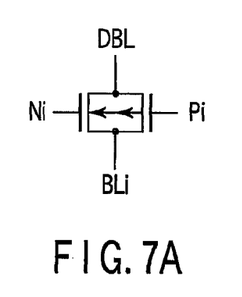
FIGS. 7A and 7B are a circuit diagram showing the configuration of switching circuits shown in FIG. 6.
Figure 7B:
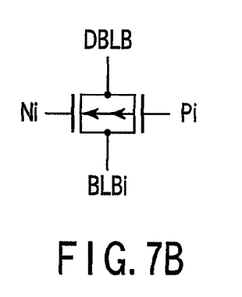

FIGS. 7A and 7B show each configuration of the switching circuits SWi and SWiB. The switching circuits SWi and SWiB each have a NMOSFET and a PMOSFET connected in parallel, and comprise a CMOS transfer gate, which is switch-controlled according to complementary signals (column select signals) Ni and Pi supplied to each gate. One terminal of switching circuits SWi and SWiB is each connected the bit line BLi or BLBi while the other terminal thereof is connected to an output node of the first or second leakage current compensating circuit 521 or 522.

According to the third embodiment, the first and second leakage current compensating circuits 521 and 522 each have the following configuration. In the MOSFET of the SRAM 51, the output node is connected to the bit line, and a plurality of NMOSFETs having the same polarity as the NMOSFET, which is a factor of generating a bit line leakage current, is connected in parallel. Each NMOSFET of the circuits 521 and 522 is biased to turn off because the gate electrode is connected to the GND node and a source electrode functioning as the input node is connected to the VDD node, as described above. In this way, the first and second leakage current compensating circuits 521 and 522 compensate a bit line leakage current of the selected column in the cell array 51*a* using a leakage current.

The foregoing SRAM can obtain the same effect as the N-type ROM 10 of the first embodiment.

Internal or peripheral portion of the cell array 51*a* is provided with dummy bit cell column or row (not shown). The diffusion pattern and the gate pattern shape of the dummy bit cell is the same as a part or all diffusion pattern and gate pattern shape of the memory cell. In this case, the diffusion pattern and the gate pattern of each MOSFET of the first and second leakage current compensating circuits 521 and 522 may be formed using a part or all of a diffusion region and a gate region of the dummy bit cell. In also case, the same effect as above is obtained.

<First Modification Example of Third Embodiment>

Figure 8:
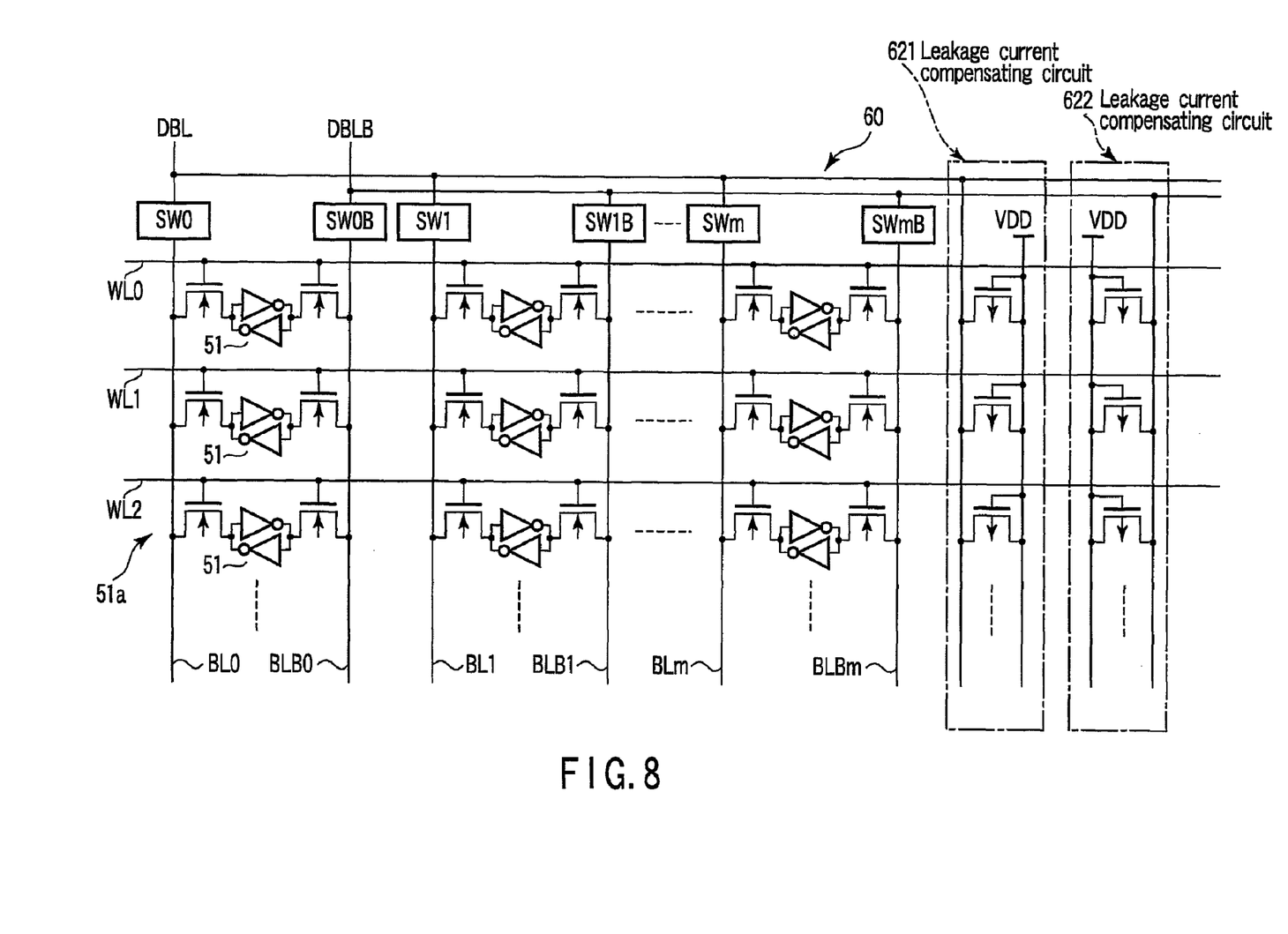
FIG. 8 is a circuit diagram showing the configuration of a part of an SRAM according to a first modification example of the third embodiment.

FIG. 8 is a circuit diagram showing the configuration of a part of an SRAM according to a first modification example of the third embodiment, and an example to which the second embodiment is applied. An SRAM 60 differs from the SRAM 50 of the foregoing third embodiment in the following point. Specifically, each MOSFET of first and second leakage current compensating circuits 621 and 622 has a different polarity. The circuits 621 and 622 each have the following configuration. Namely, in the MOSFET of the SRAM 51, an output node is connected to the bit line, and a plurality of PMOSFETs having a polarity different from NMOSFET, which is a factor of generating a bit line leakage current is connected in parallel. Each PMOSFET of the first and second leakage current compensating circuits 621 and 622 is biased to turn off by connecting a gate electrode and a source electrode to a VDD node. A drain of each PMOSFET included in the leakage current compensating circuit 621 is connected to the other terminal of the switching circuit SWi. A drain of each PMOSFET included in the leakage current compensating circuit 622 is connected to the other terminal of the switching circuit SWiB. The leakage current compensating circuits 621 and 622 compensate a bit line leakage current of the selected column in the cell array using a leakage current.

The foregoing SRAM 60 can obtain the same effect as the SRAM 50 of the third embodiment.

Fourth Embodiment

Figure 9:
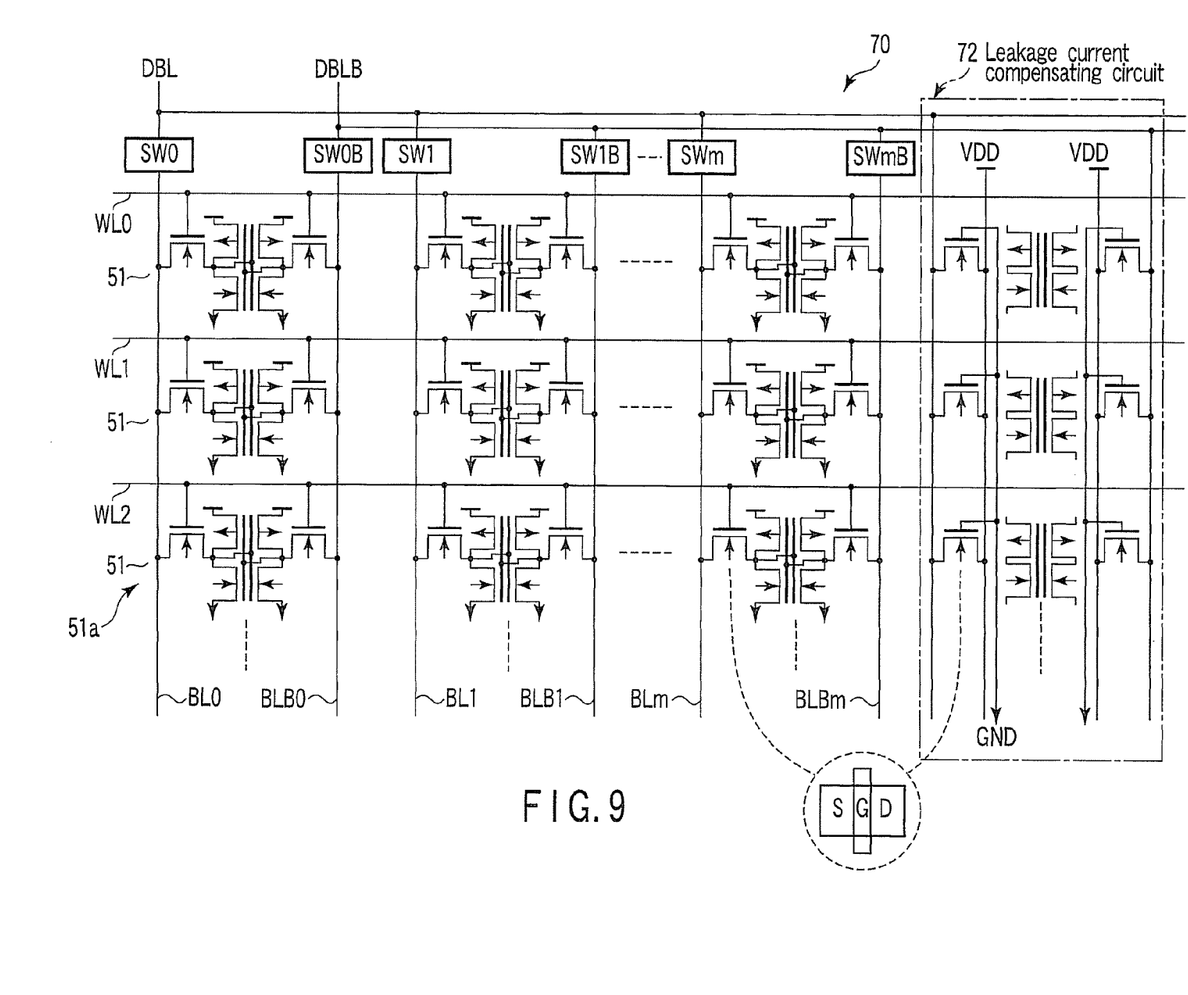
FIG. 9 is a circuit diagram showing the configuration of a part of an SRAM according to a fourth embodiment.

FIG. 9 is a circuit diagram showing the configuration of a part of an SRAM according to a fourth embodiment, and an example to which the third embodiment is applied. An SRAM 70 includes a leakage current compensating circuit 72 having the configuration different from the SRAM 50 of the third embodiment. Specifically, the leakage current compensating circuit 72 has a plurality of dummy SRAM cells arrayed like a matrix. Each dummy SRAM cell includes a MOSFET having the same configuration and dimension as various MOSFETs used for driver/load/transfer in an SRAM cell 51. Of dummy SRAM cells, only NMOSFET having the same dimension as the driver NMOSFET is used for leakage current compensation. MOSFETs having the same dimension as other load/transfer MOSFET are not used for leakage current compensation. The NMOSFET used for leakage current compensation has the following configuration. A gate electrode is connected to a GND node, and a drain is connected to one terminal of a switching circuit SWi or SWiB, and further, a source electrode is connected to a VDD node. Thus, the NMOSFET is biased to turn off.

Various MOSFETs of the leakage current compensating circuit 72 have the same diffusion pattern and gate pattern shape as those of driver/load/transfer various MOSFETs of the SRAM 51.

The foregoing SRAM 70 operates in the same manner as the SRAM 50 of the third embodiment, and can obtain the same effect as the third embodiment.

<First Modification Example of Fourth Embodiment>

Figure 10:
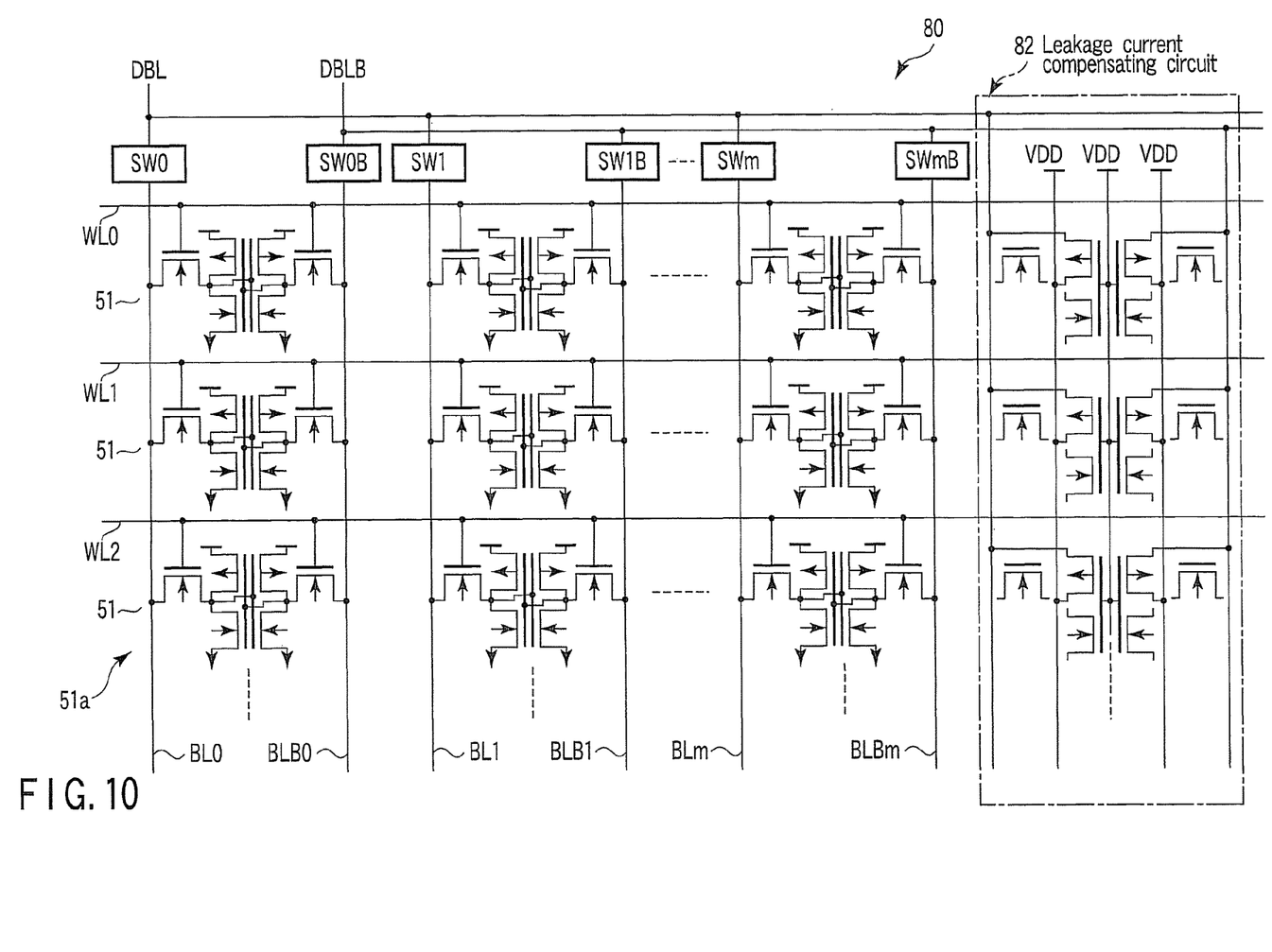
FIG. 10 is a circuit diagram showing the configuration of a part of an SRAM according to a first modification example of the fourth embodiment.

FIG. 10 is a circuit diagram showing the configuration of a part of an SRAM according to a first modification example of the fourth embodiment, and an example to which the third embodiment is applied. An SRAM 80 includes a leakage current compensating circuit 82 having the configuration different from the SRAM 70 of the fourth embodiment. Specifically, the leakage current compensating circuit 82 has the following configuration. Dummy SRAM cells including MOSFETs having the same configuration and dimension as MOSFETs (driver/load/transfer various MOSFETs) of the SRAM cell 51 are arrayed like a matrix. Of dummy SRAM cells, only PMOSFET having the same dimension as load PMOSFET is used for leakage current compensation. MOSFETs having the same dimension as other driver/transfer MOSFETs are not used for leakage current compensation. The PMOSFET used for leakage current compensation has the following configuration. A gate electrode and a source electrode are connected to a VDD node, and a drain is connected to the switching circuit SWi or SWiB. Thus, the MOSFET is biased to turn off.

Various MOSFETs of the leakage current compensating circuit 82 have the same diffusion pattern and gate pattern shape as those of driver/load/transfer various MOSFETs of the SRAM 51.

The foregoing SRAM 80 operates in the same manner as the SRAM 60 of the third embodiment, and can obtain the same effect as the third embodiment.

Fifth Embodiment

Figure 11:
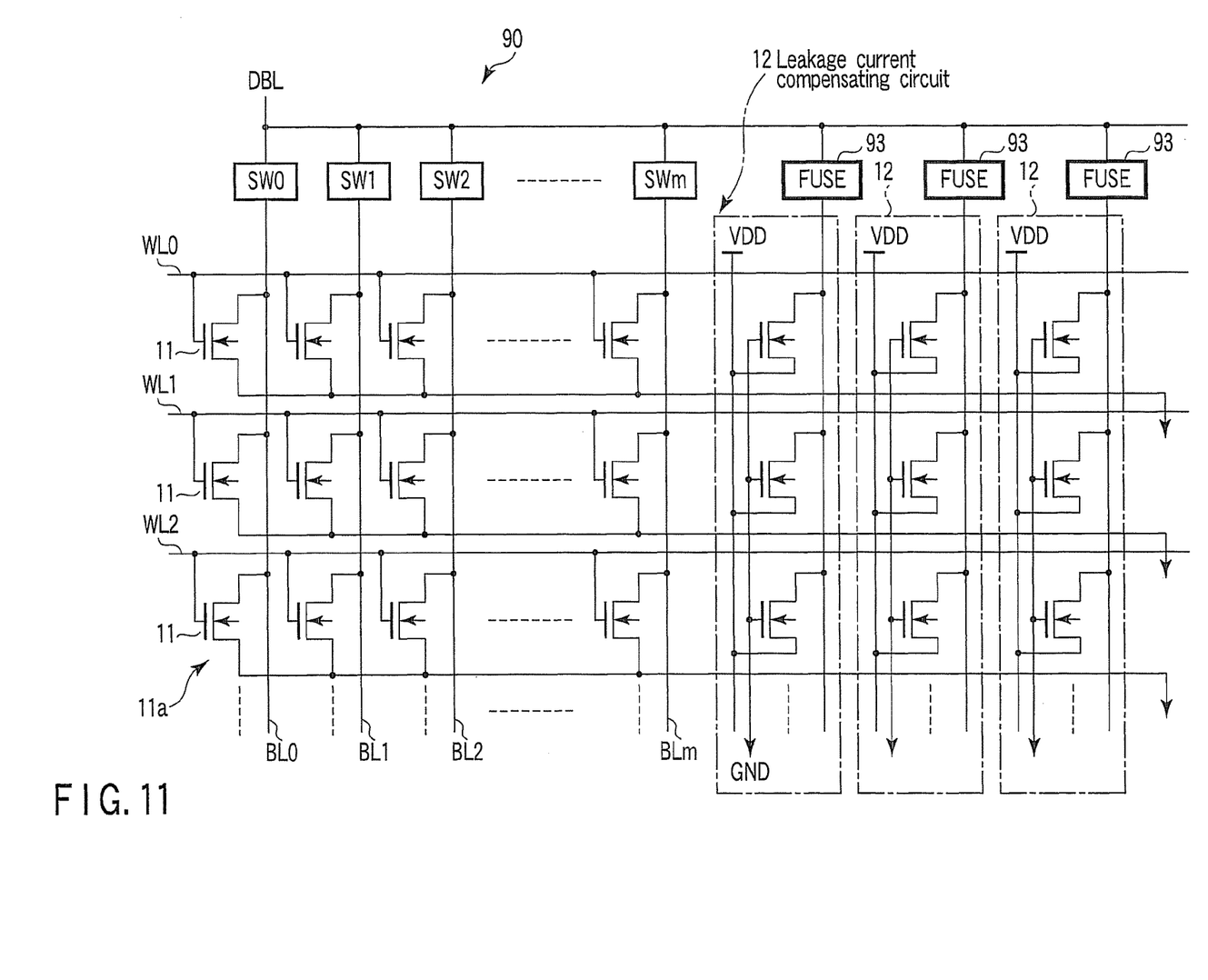
FIG. 11 is a circuit diagram showing the configuration of a part of an N-type ROM circuit according to a fifth embodiment.

FIG. 11 is a circuit diagram showing the configuration of a part of an N-type ROM according to a fifth embodiment, and an example to which the first embodiment is applied. An N-type ROM 90 differs from the N-type ROM 10 of the foregoing first embodiment in the following point. Namely, a fuse element (FUSE) 93 is interposed between a data bit line DBL connected with bit lines BLi via a switching circuit SWi and a plurality of leakage current compensating circuits 12. Specifically, the N-type ROM 90 has a plurality of leakage current compensating circuits 12, and a fuse element 93 connected between each leakage current compensating circuit 12 and the switching circuit SWi. In accordance with the final processed state of a wafer, actually used one or some fuse elements of the fuse elements are left, and other one or several fuse elements are cut off.

In the foregoing N-type ROM 90, several leakage current compensating circuits 12 are each connected to the bit line BLi via the corresponding fuse element 93 and switching circuit SWi. Thus, after the wafer is produced, the number of finally used (connected) leakage current compensating circuits 12 is adjusted. In this case, compensation leakage current is adjustable by cutting off some of the fuse elements 93 provided with respect to each data bit line DBL. In other words, after the wafer is prepared, compensation leakage current is adjustable; therefore, the effect of the first embodiment is optimized.

The foregoing first to fifth embodiment may be carried out in combination with those.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a cell array having a plurality of memory cells arranged in a matrix;
   a plurality of word lines configured to correspond to each row of the cell array, and each connected to the memory cell;
   a plurality of bit lines configured to correspond to each column of the cell array, and each connected to the memory cell;
   a plurality of switching circuits provided to correspond to each bit line, each one terminal of the switching circuits being connected to the corresponding bit line; and
   a leakage current compensating circuit having an output node connected in common to another terminal of the switching circuits, the switching circuits being each controlled so that only a circuit connected to a bit line of a selected column in the cell array conducts,
   wherein the leakage current compensating circuit comprises a plurality of MOSFETs, each of the MOSFETs has the same conductivity type as a MOSFET directly connected to the bit line and included in each of the memory cells, each of the MOSFETs of the leakage current compensating circuit has a current path and a gate electrode, one end of the current path is connected to the other terminal of the switching circuits, the gate electrode is connected to a first voltage node and another end of the current path is connected to a second voltage node, and each of the MOSFETs is biased to turn off.

2. The device according to claim 1, wherein the leakage current compensating circuit compensates a bit line leakage current of the selected column in the cell array using a leakage current.

3. The device according to claim 1, wherein each MOSFET of the leakage current compensating circuit has a diffusion pattern/gate pattern shape same as those of a part or all of a MOSFET of the memory cell, and a plurality of MOSFETs of the leakage current compensating circuit is arrayed like a matrix in the same manner as the cell array.

4. The device according to claim 1, further comprising:
   a plurality of dummy bit cells arranged on an internal or peripheral portion of the cell array, a diffusion pattern and a gate pattern shape of each dummy bit cell being the same as those of a part or all of the memory cell, each MOSFET of the leakage current compensating circuit being configured using a part or all of a diffusion region and a gate region of the dummy bit cell.

5. The device according to claim 1, wherein each of the memory cells is a static RAM cell.

6. The device according to claim 5, wherein the leakage current compensating circuit has a plurality of dummy static RAM cells, and each of the dummy static RAM cells has a MOSFET used as a driver, and further, the MOSFET used as the driver has a current path and a gate electrode, the gate electrode is connected to the first voltage node, one end of the current path is connected to the second voltage node and another end of the current path is connected to the other terminal of the switching circuits, and each of the MOSFETs is biased to turn off.

7. The device according to claim 5, wherein the leakage current compensating circuit has a plurality of leakage current compensating circuits.

8. The device according to claim 7, wherein a fuse element is connected between each of the leakage current compensating circuits and the other terminal of the switching circuits.

9. The device according to claim 1, wherein each MOSFET is an N-channel transistor, and the first voltage node is supplied with a ground potential while the second voltage node is supplied with a potential higher than the ground potential.

* * * * *